(12) United States Patent
Nakata

(10) Patent No.: US 8,030,569 B2
(45) Date of Patent: *Oct. 4, 2011

(54) LIGHT RECEIVING OR LIGHT EMITTING SEMICONDUCTOR MODULE

(75) Inventor: Josuke Nakata, Kyoto (JP)

(73) Assignee: Kyosemi Corporation, Kyoto (JP)

( * ) Notice: Subject to any disclaimer, the term of this patent is extended or adjusted under 35 U.S.C. 154(b) by 635 days.

This patent is subject to a terminal disclaimer.

(21) Appl. No.: 12/086,346

(22) PCT Filed: Jan. 11, 2006

(86) PCT No.: PCT/JP2006/300196
§ 371 (c)(1),
(2), (4) Date: Jun. 11, 2008

(87) PCT Pub. No.: WO2007/080631
PCT Pub. Date: Jul. 19, 2007

(65) Prior Publication Data
US 2010/0219423 A1 Sep. 2, 2010

(51) Int. Cl.
*H02N 6/00* (2006.01)
*H01L 31/042* (2006.01)
(52) U.S. Cl. ........ 136/250; 136/251; 136/256; 136/244; 257/726; 257/100; 257/81; 257/99
(58) Field of Classification Search ............... 136/250, 136/251; 257/726, 100, 99, 81
See application file for complete search history.

(56) References Cited

U.S. PATENT DOCUMENTS

| | | | | |
|---|---|---|---|---|
| 3,009,981 A * | 11/1961 | Wildi et al. | ............... | 136/263 |
| 6,204,545 B1 * | 3/2001 | Nakata | ............... | 257/459 |
| 6,417,442 B1 * | 7/2002 | Fukui et al. | ............... | 136/250 |
| 6,744,073 B1 * | 6/2004 | Nakata | ............... | 257/81 |
| 2010/0006865 A1 * | 1/2010 | Nakata | ............... | 257/88 |

FOREIGN PATENT DOCUMENTS

| | | | |
|---|---|---|---|
| EP | 1445804 A1 * | 8/2004 | |
| JP | 9-162434 | 6/1997 | |
| JP | 2001-267609 | 9/2001 | |
| WO | WO-98/15983 | 4/1998 | |
| WO | WO-02/035612 | 5/2002 | |
| WO | WO-02/35613 | 5/2002 | |
| WO | WO-03/017382 | 2/2003 | |
| WO | WO-03/036731 | 5/2003 | |

* cited by examiner

Primary Examiner — Jennifer K. Michener
Assistant Examiner — Marla D McConnell
(74) Attorney, Agent, or Firm — Jordan and Hamburg LLP

(57) ABSTRACT

Multiple semiconductor elements in a semiconductor module in which multiple spherical light receiving or emitting semiconductor elements are installed can easily be retrieved, reused, or repaired. In a semiconductor module 60, two segment modules 61 are serially arranged in a storage casing 62. The segment modules 61 are each formed by molding solar battery cells 10 arranged in a matrix of multiple rows and columns, and a conductive connection mechanism serially-connecting the solar battery cells 10 in each column and parallel-connecting the solar battery cells 10 in each row in a synthetic resin with connection conductors 67 protruding at the ends. Conductive corrugated springs 70 and external terminals 76 are provided at the ends of the storage casing 62. The mechanical pressing force of the conductive corrugated springs 70 ensures that the two segment modules 61 are serially connected.

8 Claims, 12 Drawing Sheets

LIGHT RECEIVING OR LIGHT EMITTING SEMICONDUCTOR MODULE

TECHNICAL FIELD

The present invention relates to a light receiving or light emitting semiconductor module in which multiple spherical semiconductor elements having light receiving or light emitting capability are electrically connected in series and in parallel for high output.

BACKGROUND TECHNOLOGY

The inventor of the present invention has proposed a spherical semiconductor element having light receiving or light emitting capability that has positive and negative electrodes at opposite positions about the center thereof, and a solar battery module wherein multiple sets of multiple semiconductor elements are serially connected in each set and the multiple semiconductor elements are embedded in a synthetic resin material as set forth in the publication of WO98/15983. In the solar battery module, the semiconductor elements have a spherical form and a spherical pn-junction in the surface. Positive and negative electrodes are provided in the centers of the surfaces of the p-type and n-type regions forming the pn-junction.

The inventor of the present invention has proposed a solar battery module wherein the above spherical semiconductor elements are arranged in multiple rows and columns, the semiconductor elements in each row are connected in parallel by conductive members and solder or conductive adhesive, the semiconductor elements in each column are connected in series by lead members and solder, and they are embedded in a synthetic resin material as set forth in the publication of WO02/35612, WO02/35613, and WO03/017382.

The inventor of the present invention has further proposed a semiconductor module having light receiving or light emitting capability wherein multiple semiconductor elements are embedded in a synthetic resin material as set forth in the publication of WO03/036731.

Recently, solar batteries are increasingly in use as a renewable clean energy source relative to environmental issues such as air pollution and global warming and exhaustion of fossil fuels. Light emitting diodes are also increasingly in use as illumination source from the viewpoint of energy and resource saving. There is also an increasing need of saving resources for materials and reducing production energy consumption.

Patent Document 1: WO98/15983;
Patent Document 2: WO02/35612;
Patent Document 3: WO02/35613;
Patent Document 4: WO03/017382; and
Patent Document 5: WO03/036731.

DISCLOSURE OF THE INVENTION

Problems to be Solved by the Invention

In prior art solar battery module or light emitting diode displays, a number of granular semiconductor elements are connected to conductive members by solder or conductive adhesive and are embedded in a synthetic resin cover casing (outer enclosure) to form a module. Therefore, a number of semiconductor elements cannot be separated from the cover casing for recovering them upon disposal of the solar battery module. For this reason, it is difficult to recover semiconductor elements from solar battery modules or light emitting diode displays and reuse them. A resolution taking into account resources and natural environments is required.

When a large number of semiconductor elements as described above come to be in practical use in the near future, their replacement and disposal is accordingly increased as a result of deterioration and expiration of life-span. Loads on resources and natural environments are likely increased. Particular restriction has been imposed on the use of their lead-containing solder materials.

The purpose of the present invention is to provide a light receiving or emitting semiconductor module that is applicable to solar battery modules and light emitting diode displays in which multiple granular light receiving or emitting semiconductor elements are installed and facilitates reuse, reproduction, and repair of multiple semiconductor elements.

Problem Resolution Means

The light receiving or light emitting semiconductor module of the present invention is a light receiving or light emitting semiconductor module comprising multiple spherical semiconductor elements having light receiving or light emitting function, characterized by comprising positive and negative electrodes provided to each of the multiple semiconductor elements at opposite positions about the center thereof; a holding means for holding the multiple semiconductor elements in a manner arranged in multiple columns and multiple rows with their conducting direction aligned in a column direction and multiple semiconductor elements are separable individually or in multiple groups; a conductive connection mechanism connecting in series the semiconductor elements in each column or in two adjacent columns among multiple columns of semiconductor elements and connecting in parallel the semiconductor elements in each row among multiple rows of semiconductor elements; and conductive elastic members applying a mechanical pressing force in a column direction to maintain the serial connection of multiple columns of semiconductor elements by the conductive connection mechanism.

In this light receiving or light emitting semiconductor module, the conductive connection mechanism connects in series the semiconductor elements in each column or the semiconductor elements in two adjacent columns and connects in parallel the semiconductor elements in each row. When some semiconductor elements or some connection between semiconductor elements fails, the current flows through an alternative path bypassing the failed semiconductor element or disconnected point, effectively operating all normal semiconductor elements.

If the semiconductor module is a solar battery module, when some semiconductor elements are disabled because they are shaded, the current flows through an alternative path as in the above case.

If the semiconductor module is a light emitting diode display, the current flows through an alternative path as in the above case and all normal semiconductor elements operate effectively.

The conductive connection mechanism has conductive elastic members applying a mechanical pressing force in the column direction to maintain the serial connection of multiple columns of semiconductor elements, eliminating the connection by solder or conductive adhesive between a semiconductor element and a conductive member and between conductive members.

For disposal or repair of the semiconductor module, the holding means is disassembled to separate multiple semiconductor elements individually or in multiple groups. Multiple semiconductor elements can be retrieved individually or in groups. Other preferable structures of the present invention will easily be understood from embodiments of the present invention described later.

Advantages of the Invention

The light receiving or light emitting semiconductor module of the present invention has a holding means for holding multiple semiconductor elements individually or in multiple groups and conductive elastic members applying a mechanical pressing force in the column direction to maintain the serial connection of multiple columns of semiconductor elements by the conductive connection mechanism. For disposal or repair of the semiconductor module, multiple semiconductor elements can be removed individually or in groups, facilitating reuse, reproduction, or repair of semiconductor elements, eliminating the need for prior art solder or conductive adhesive connection.

Figure 1:
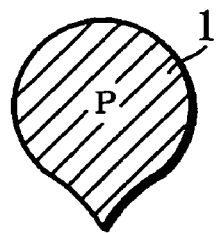
FIG. 1 is a cross-sectional view of a solidified silicon crystal relating to an embodiment of the present invention.

LEGEND 5 positive electrode
6 negative electrode
10 solar battery cell
11 holding mechanism
12 conductive connection mechanism
13 corrugated retention spring
14 storage casing
15 storage zone
16 outer frame
17 casing plate
18, 19 first, second outer frame
23 elastic film
30, 40 solar battery module
41 holding mechanism
42 conductive connection mechanism
42a conductive wire
43 conductive elastic member
43a corrugated spring
44 storage zone
45 storage casing
46 outer frame
47 casing plate
47a silicone rubber coating (elastic film)
48, 49 first, second outer frame
51 terminal plate
60 solar battery module
61 segment module
62 storage casing
63 casing member
65 storage zone
66 conductive wire
70 corrugated spring
76 external terminal

BEST MODE FOR IMPLEMENTING THE INVENTION

The present invention relates to a light receiving or light emitting semiconductor module comprising multiple spherical semiconductor elements having light receiving or light emitting function wherein multiple semiconductor elements are separable individually or in multiple groups for disposal or repair of the semiconductor module.

Embodiment 1

First, the solar battery module (light receiving semiconductor module) of Embodiment 1 will be described. The structure and production method of a spherical silicon solar battery cell (semiconductor element) will be described with reference to FIGS. 1 to 7. The structure and production method of this spherical silicon solar battery cell is disclosed in the publication of WO03/017382 by the inventor of the present invention and is therefore briefly explained here.

FIG. 1 is a cross-sectional view of a p-type spherical silicon crystal 1 (monocrystal or polycrystal) having a diameter of 1.0 to 2.0 mm. The granular silicon crystal 1 is produced by melting a silicon row material in a crucible at the top of a drop tube, discharging silicon droplets from the nozzle orifice of the crucible and allowing them to free-fall in the drop tube approximately 14 m. The droplets shaped into a sphere due to surface tension during the fall are cooled and solidified into spherical crystal and recovered at the bottom of the drop tube. The silicon crystal 1 of this embodiment is monocrystalline silicon. Those solidified at the end of solidifying process may have a projection as shown in FIG. 1. The projection is removed and polished to a sphere.

Figure 2:
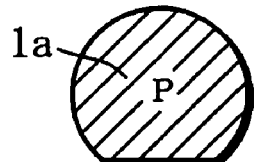
FIG. 2 is a cross-sectional view of a silicon crystal from which the projection is cut away.
Figure 3:
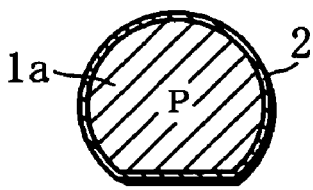
FIG. 3 is a cross-sectional view of a silicon crystal on which a silicon oxide film is formed.
Figure 4:
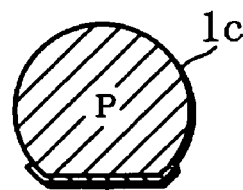
FIG. 4 is a cross-sectional view of a silicon crystal from which the silicon oxide film is partly removed.

As shown in FIG. 2, the surface of the spherical silicon crystal 1 is polished and partly flattened to form a reference surface 1b, thereby obtaining a silicon crystal 1a. The silicon crystal 1a has a diameter of approximately 1.8 mm. As shown in FIG. 3, a silicon oxide film 2 is formed on the entire surface of the silicon crystal 1a by a known thermal oxidation technique. As shown in FIG. 4, the silicon oxide film 2 is removed except for a silicon oxide film 2a on the reference surface 1b and its vicinity. The silicon oxide film 2a is used as a mask in the subsequent impurity diffusion. It is a known technique to leave such a silicon oxide film in part as above using a mask.

Figure 5:
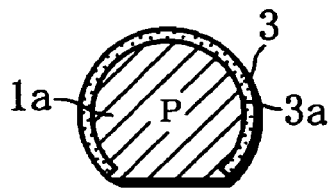
FIG. 5 is a cross-sectional view of a silicon crystal on which an n-type diffused layer and a pn-junction are formed.
Figure 6:
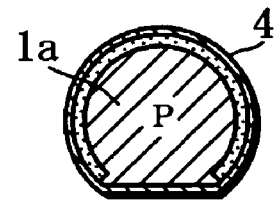
FIG. 6 is a cross-sectional view of a silicon crystal on which a silicon oxide coating is formed.

As shown in FIGS. 4 and 5, an n-type impurity is thermally diffused through the exposed p-type surface 1c into the surface by a known thermal diffusion technique using the silicon oxide film 2a as a mask to form an n-type layer 3, forming a nearly spherical pn-junction 3a. The nearly spherical pn-junction 3a is formed except for the reference surface 1b and its vicinity. The silicon oxide film incidentally generated during the thermal diffusion of n-type impurity is once removed by known chemical etching. Then, the silicon crystal 1a is again heated in an oxygen-containing atmosphere to form on the entire surface a silicon oxide film 4 to a predetermined thickness as shown in FIG. 6. The silicon oxide film 4 serves as an antireflection coating.

Figure 7:
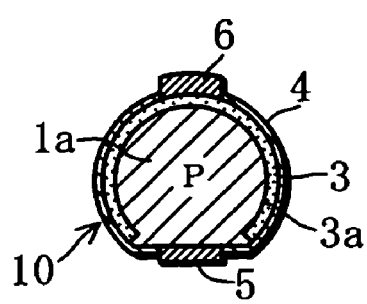
FIG. 7 is a cross-sectional view of a solar battery cell.
Figure 8:
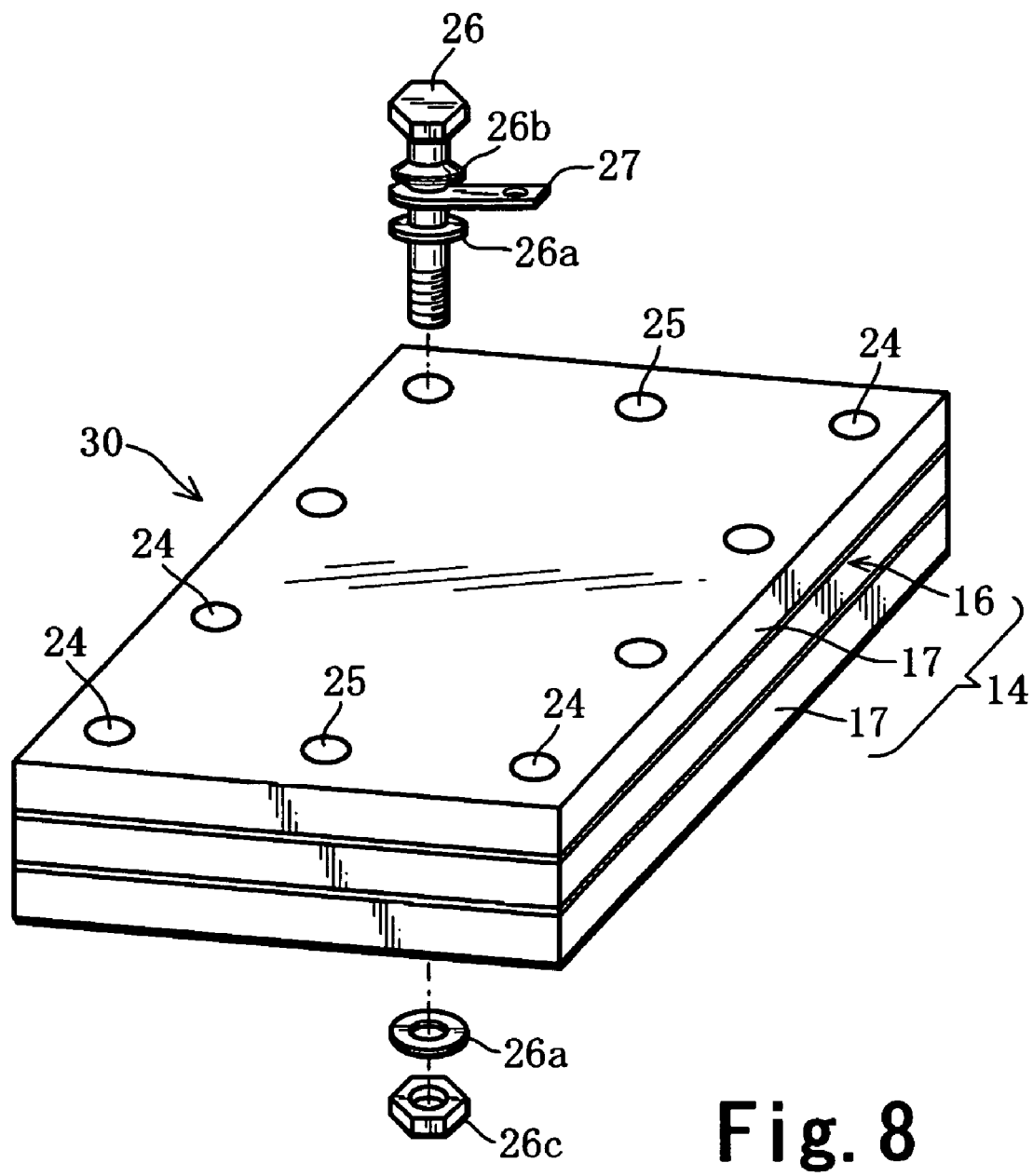
FIG. 8 is an exploded perspective view of the solar battery module of Embodiment 1.
Figure 9:
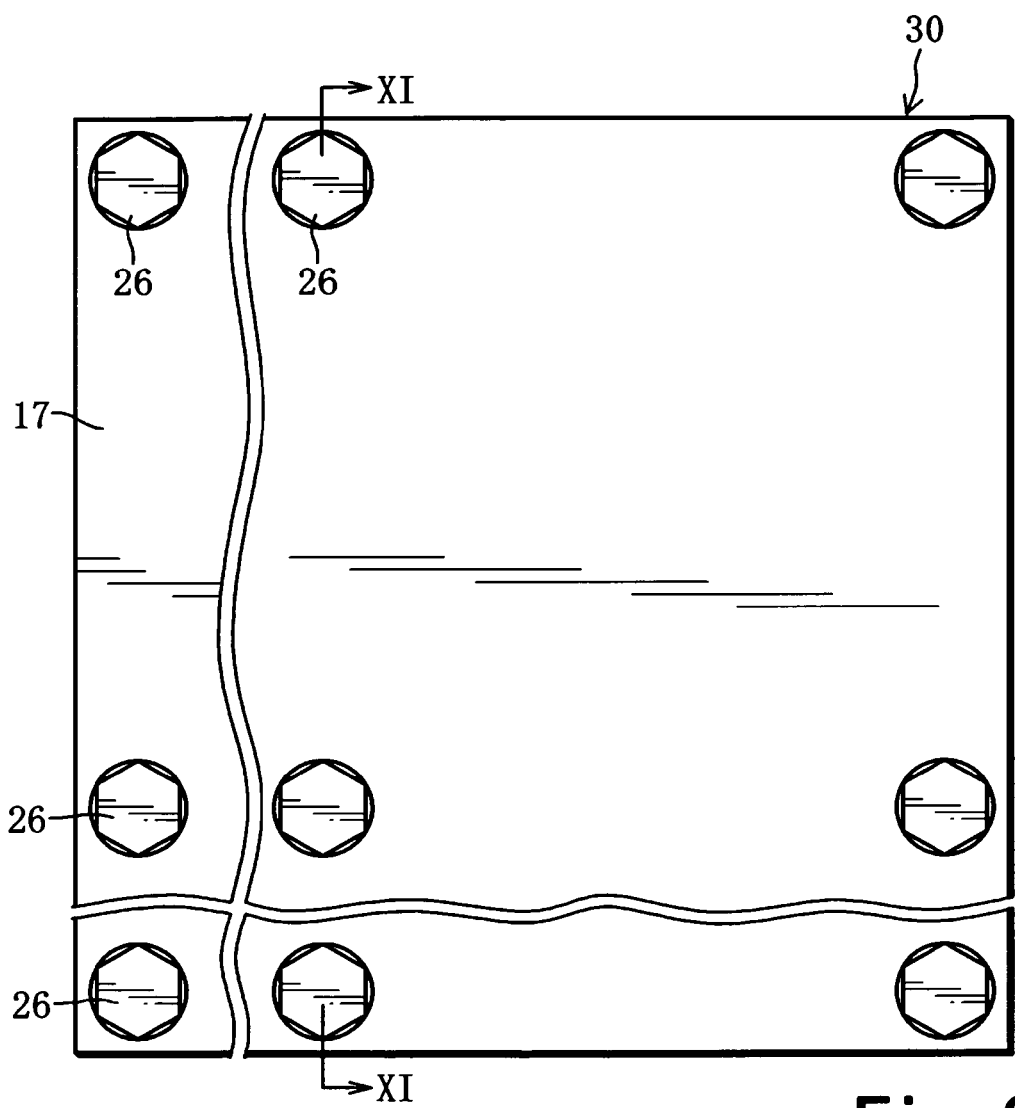
FIG. 9 is a plane view of the solar battery module of FIG. 8.
Figure 10:
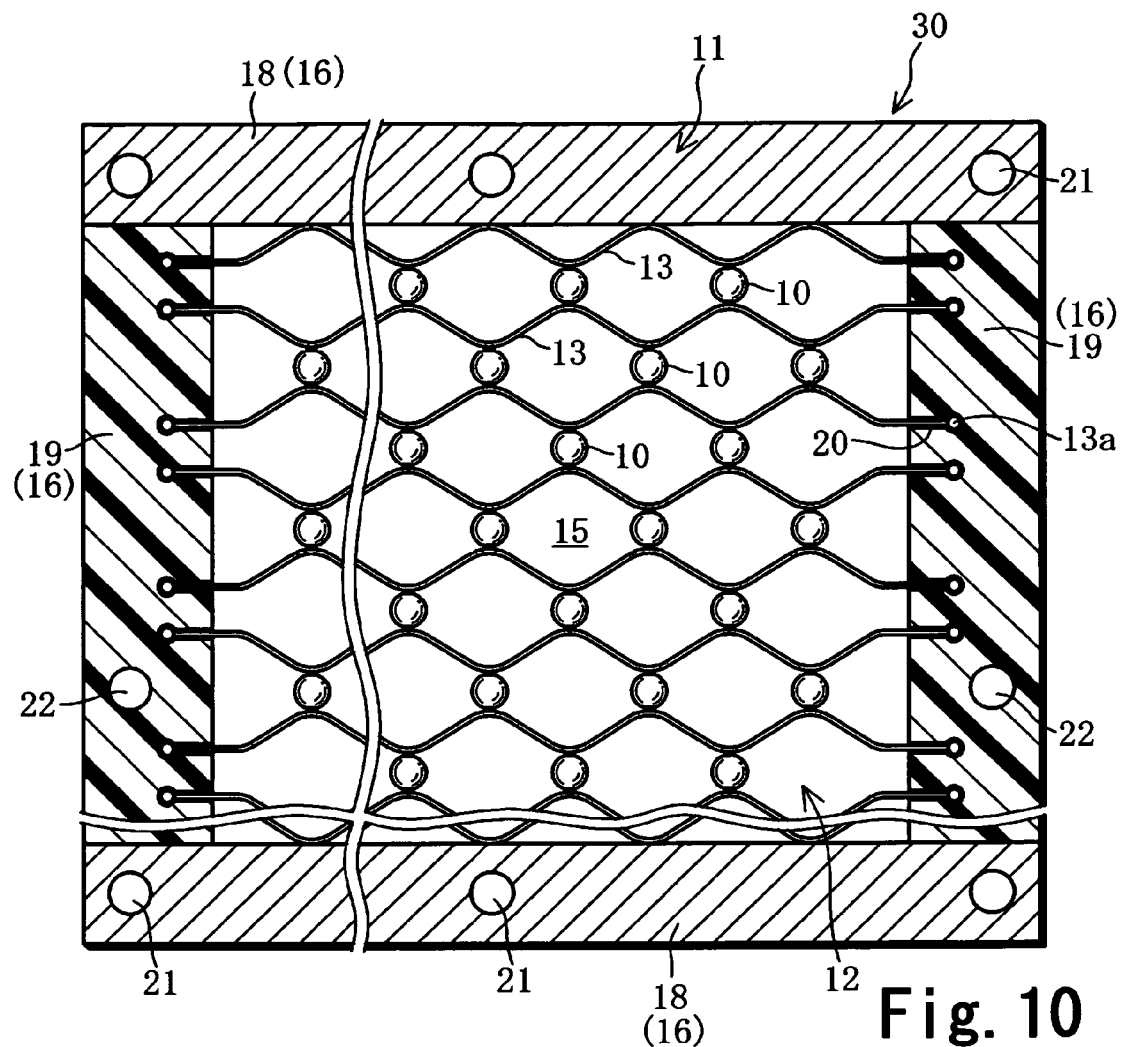
FIG. 10 is a horizontal cross-sectional plane view of the solar battery module of FIG. 8.
Figure 11:
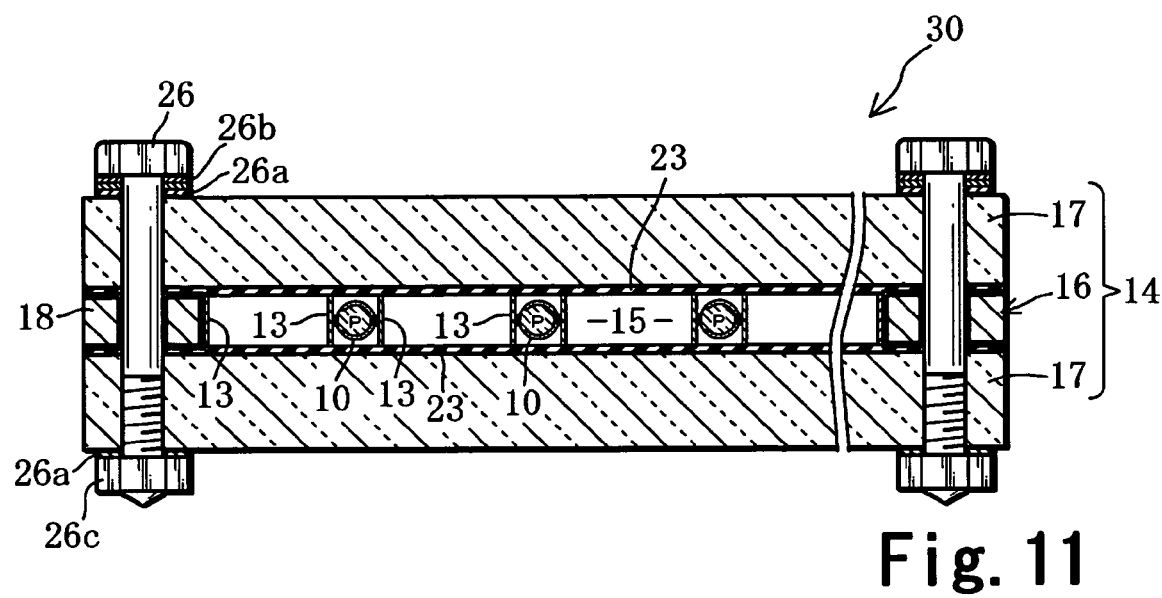
FIG. 11 is a vertical cross-sectional view of the solar battery module of FIG. 8.
Figure 12:
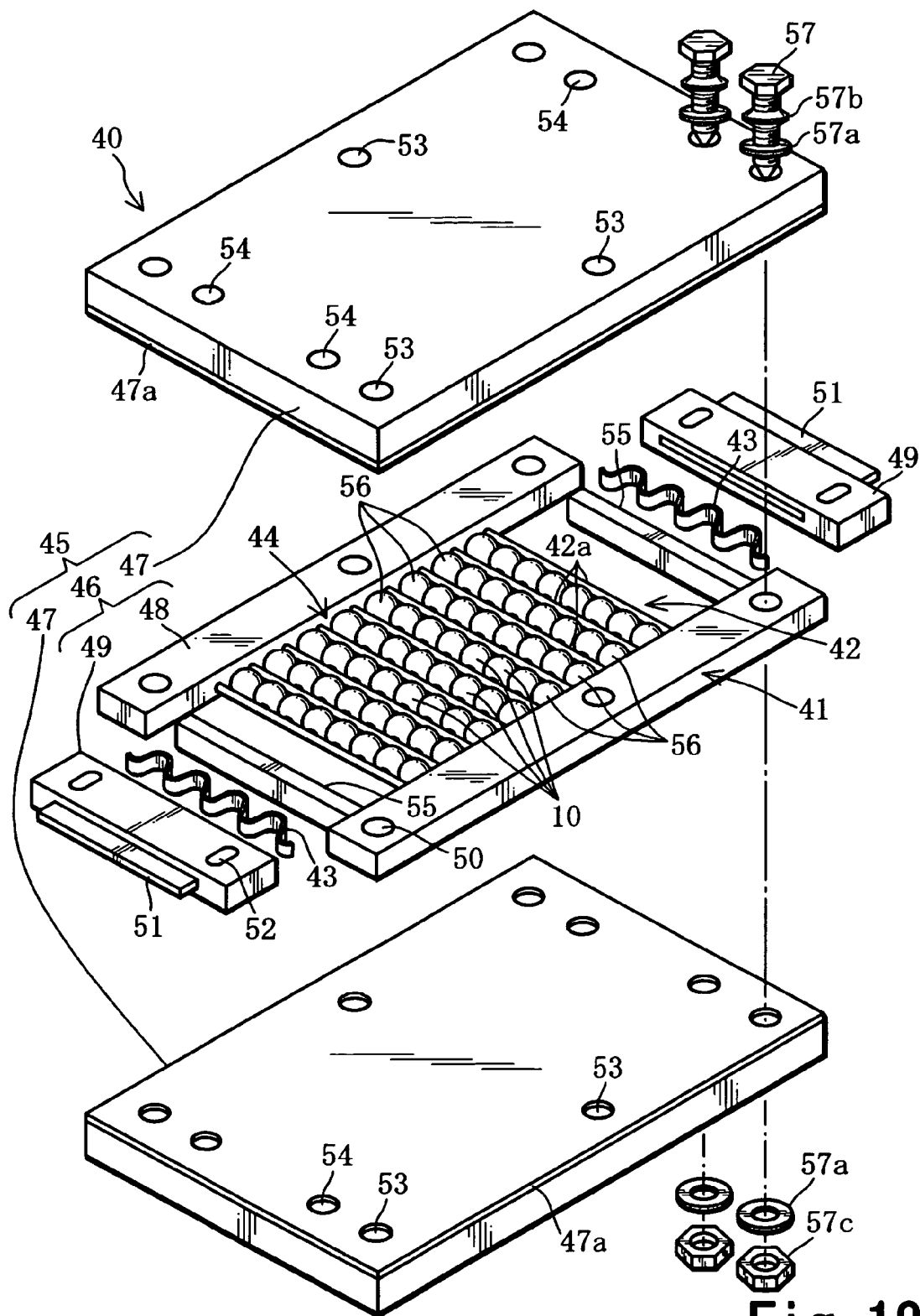
FIG. 12 is an exploded perspective view of the solar battery module of Embodiment 2.
Figure 13:
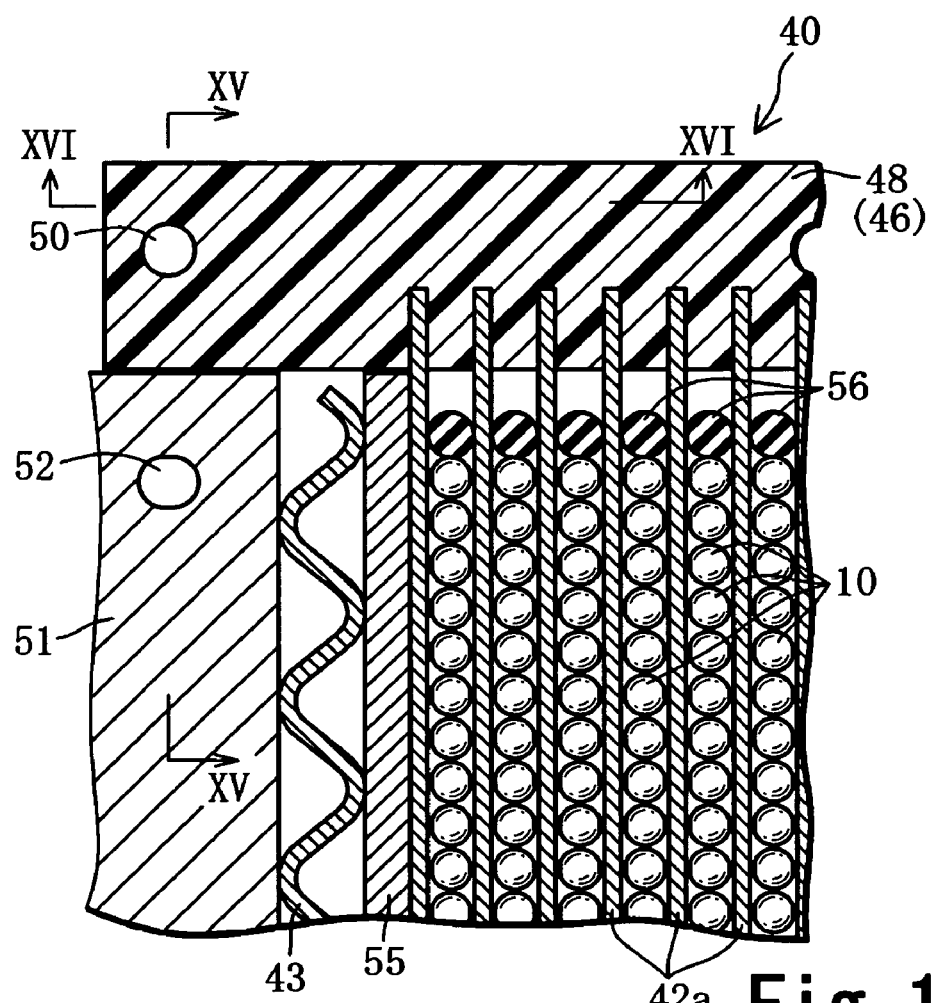
FIG. 13 is an enlarged cross-sectional view of the core part of the solar battery module of FIG. 12.
Figure 14:
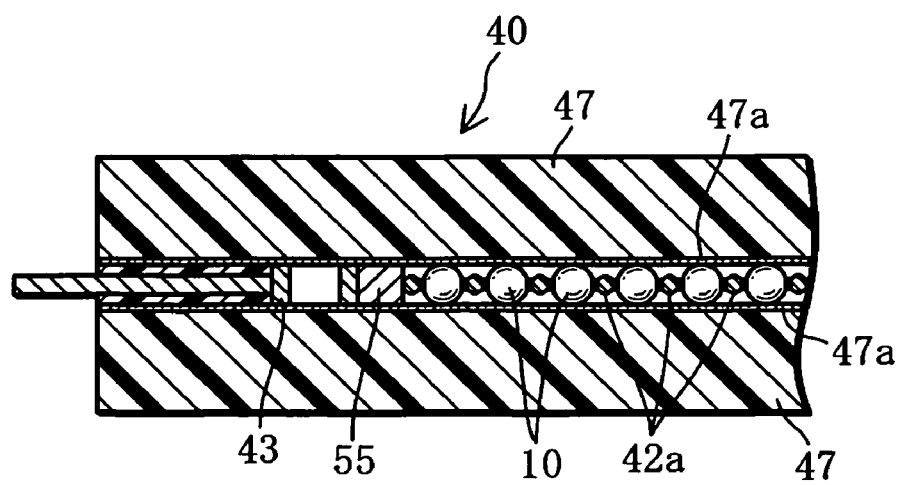
FIG. 14 is an enlarged cross-sectional view of the core part of the solar battery module of FIG. 12.
Figure 15:
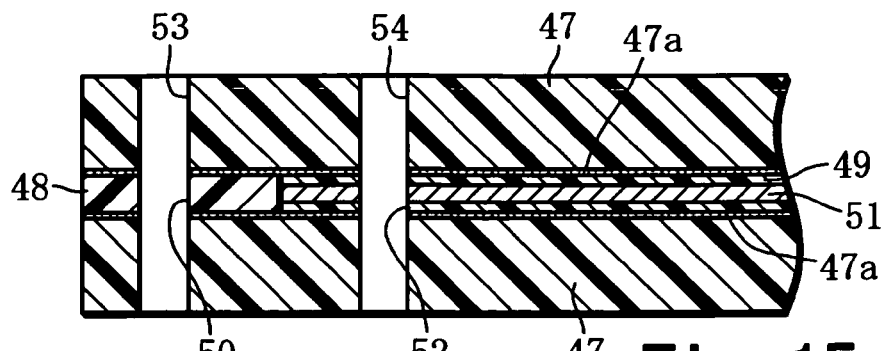
FIG. 15 is a cross-sectional view at the line XV-XV in FIG. 13.
Figure 16:
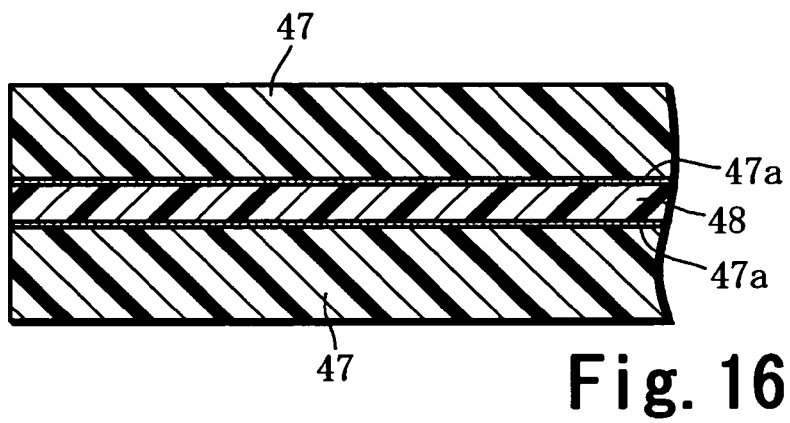
FIG. 16 is a cross-sectional view at the line XVI-XVI in FIG. 13.

Subsequently, a silver-based paste is printed in dots on the flat reference surface 1b (p-type) and on the top (n-type) of the silicon crystal at the position opposite to the reference surface 1b about the center of the silicon crystal 1a and processed at a high temperature for a short time. Consequently, as shown in FIG. 7, the paste penetrates the silicon oxide film 4 and makes ohmic contact with the p-type silicon reference surface 1b and the surface of the n-type layer 3 to form a positive electrode 5 and a negative electrode 6, respectively.

The granular and spherical solar battery cell 10 as prepared above has a spherical pn-junction 3a at a uniform depth below the surface of the silicon crystal 1a and therefore converts photoelectrically incident light from all direction at a nearly equal light receiving sensitivity. A spherical light emitting diode having such a spherical pn-junction emits uniform light from the spherical surface in all direction using the electric energy input from the positive electrode 5.

A solar battery module 30 having of a number of the above described spherical solar battery cells 10 connected in series and in parallel will be described hereafter with reference to FIGS. 8 to 11. The solar battery module 30 is a double glass solar battery module. The solar battery module 30 has a rectangular light receiving surface of for example approximately 50 mm to 75 mm on a side. This dimension of the light receiving surface is given by way of example. A larger solar battery module can also be constituted.

The solar battery module 30 comprises a holding mechanism 11 (holding means) holding multiple solar battery cells 10 in the manner that they are arranged two-dimensionally in multiple columns and multiple rows with their conducting direction aligned in the column direction and multiple solar battery cells 10 are individually separable, a conductive connection mechanism 12 connecting in series the solar battery cells 10 in two adjacent columns among multiple columns of solar battery cells and connecting in parallel the solar battery cells in each row among multiple rows of solar battery cells 10, and multiple conductive corrugated retention springs 13 serving as conductive elastic members applying a mechanical pressing force in the column and row direction to maintain the serial connection of multiple solar battery cells 10 by the conductive connection mechanism 12.

The holding mechanism 11 comprises a tabular storage casing 14 and multiple conductive corrugated retention springs 13. The conductive connection mechanism 12 comprises multiple corrugated retention springs 13. A flat rectangular storage zone 15 is formed in the storage casing 14 to store multiple solar battery cells 10. The storage casing 14 has a rectangular outer frame 16 enclosing the storage zone 15 and transparent glass casing plates 17 closing the top and bottom sides of the storage zone 15 and outer frame 16.

The outer frame 16 consists of a pair of first parallel outer frames 18 serving as collective electrodes and a pair of second parallel outer frames 19. The second outer frames 19 are provided between the ends of the pair of first outer frames 18. The first outer frames 18 have a thickness of approximately 2 mm, each consisting of a glass cloth-based epoxy resin insulating member having on the surface a copper foil layer (a thickness of approximately 0.1 mm) formed and then silver-plated. The second outer frames 19 consist of the same insulating members as above. The second outer frames 19 have on the side to the storage zone 15 multiple slots 20 with pores to connect and retain the ends of the corrugated springs 13. The first outer frames 18 have multiple bolt holes 21, on the inner surfaces of which the same copper foil and silver plating as above are provided. The second outer frames 19 also have one or multiple bolt holes 22.

In the storage zone 15, multiple corrugated retention springs 13 are provided nearly in parallel in the manner that the troughs and crests of adjacent corrugated retention springs 13 face closely. The ends and spiral parts 13a at the tip of the corrugated retention springs 13 are fitted in the slots 20 of the second outer frames 19 to couple the corrugated retention springs 13 to the second outer frames 19. The corrugated retention springs 13 are formed by regularly corrugating a phosphor bronze strip having a thickness of approximately 0.4 mm and a width of approximately 1.9 mm and silver-plating its surface.

In the storage zone 15, multiple solar battery cells 10 (a set of solar battery cells) are arranged in multiple columns and multiple rows with their conducting direction aligned in the column direction. Multiple solar battery cells 10 in two adjacent columns are zigzagged. The solar battery cells 10 are clamped and held where the troughs and crests of adjacent corrugated retention springs 13 face closely. Abutting against a common corrugated retention spring 13, the positive electrodes 5 of the solar battery cells 10 in each row are electrically connected in parallel.

Abutting against a common corrugated retention spring 13, the negative electrodes 6 of the solar battery cells 10 in each row are electrically connected in parallel. A pair of corrugated retention springs 13 at the ends in the column direction abuts against the inner surfaces of the first outer frames 18, placing them at regulated positions and electrically connecting them to the first outer frames 18.

A number of spherical solar battery cells 10 are held by a mechanical pressing force from multiple conductive corrugated retention springs 13 and electrically connected in the storage zone 15. Among multiple columns of solar battery cells 10, the solar battery cells 10 in two adjacent columns are connected in series by multiple corrugated retention springs 13 and the solar battery cells 10 in each row are connected in parallel by the pair of corrugated retention springs 13 on either side of the row. The conductive connection mechanism 12 comprises multiple corrugated retention springs 13. The serial connection of multiple columns of solar battery cells 10 is maintained by a mechanical pressing force in the column direction that is generated by multiple corrugated retention springs 13.

Then, the transparent casing plates 17 are attached and sealed to the outer frame 16 and storage zone 15 on either side. The casing plates 17 have for example a thickness of approximately 3 mm. The casing plates 17 also have an elastic film 23 consisting of a transparent silicone rubber thin film having a thickness of approximately 0.2 mm on one surface (the inner surface). The pair of casing plates 17 is placed on either side in a sandwich structure in which the elastic films 23 make contact with a set of the solar battery cells and the outer frame 16.

The bolt holes 24 and 25 of the casing plates 17 and the bolt holes 21 and 22 of the outer frame 16 are then aligned. The casing plates 17 and outer frame 16 are fastened by steel bolts 26 and nuts 26c with washers 26a made of synthetic resin, for example fluororesin and steel disc springs 26b. A lead terminal 27 can be provided to the bolt 26 where necessary. The lead terminal 27 is electrically connected to the copper foil and silver plating layer on the inner surface of the bolt hole 21 via the bolt 26.

Here, the end corrugated retention springs 13 adjacent to the first outer frames 18 are in mechanical contact with and maintain electrical connection to the inner surfaces of the first outer frames 18 as a result of a pressing force from the corrugated retention springs 13.

However, the casing plates 17, outer frame 16, solar battery cells 10, and multiple corrugated retention springs 13 are not necessarily fastened and integrated by the bolts 26 and nuts 26c. Any coupling structure can be used as long as they are individually separable.

The storage zone 15 can be vacuumed in a vacuum container before fastened and sealed by the bolts 26 if necessary. In such a case, the vacuumed storage zone 15 is fastened by the bolts 26 and nuts 26c or the storage zone 15 is fastened with an inert gas such as nitrogen gas introduced for producing a highly heat insulated double glass solar battery module 30. To this end, it is desirable to provide a seal between the first and second outer frames 18 and 19 with a silicone rubber thin film, creating a sealed storage zone 15.

Having multiple solar battery cells 10 retained between two casing plates 17 by the outer frame 16 and multiple corrugated retention springs 13 to allow for a proper natural lighting space and room, the double glass solar battery module 30 has applications as a highly heat and sound insulated natural lighting window also having an electric power generation function.

The corrugated retention springs 13 and solar battery cells 10 also serve as a spacer to keep a uniform distance between the two casing plates 17 and increase mechanical strength. For improved heat insulation as a window, the casing plates 17 can have a low-E double glass structure having an infrared reflection coating such as silver and tin oxide on the surface.

The double glass solar battery module 30 can be used by itself or in combination with another solar battery module 30 having the same structure so that it is extended in size and they are electrically connected for larger output. In such a case, for example, a connection lead terminal 27 can be attached to the bolt 26 inserted in the first outer frame 18 for module wire connection to the other solar battery module 30.

In this double glass solar battery module 30, the spherical solar battery cells 10 absorb incident light transmitted through the transparent casing plate 17 and generate electric power according to the light energy intensity. In this regard, the solar battery cells 10 absorb not only direct light but also finally light reflected multiple times by the corrugated retention springs 13, casing plates 17, and solar battery cells 10 within the storage zone 15 and convert it to electric power. The natural lighting efficiency or exterior design as a window can be altered by modifying the positioning pattern of multiple solar battery modules 30 and the shape of the corrugated retention springs 13.

In this double glass solar battery module 30, multiple solar battery cells 10 connected in parallel by a pair of corrugated retention springs 13 are connected in series to form a mesh-structure electric circuit. Then, if some solar battery cells 10 fail and are open or if some solar battery cells 10 are electrically disconnected or if some solar battery cells 10 are disabled because they are in shade, the current flows through an alternative path bypassing the disabled solar battery cells 10 and the other normal solar battery cells 10 do not entirely or partly fail to generate electric power.

The above described solar battery module 30 has the following functions and advantages.

(1) The spherical solar battery cells 10 have mechanical strength; therefore, they can have excellent electric connection to conductors by means of a pressing force from the corrugated retention springs 13. Then, the prior art solder or conductive adhesive connection is eliminated. The bolts 26 and nuts 26c are simply disengaged to easily disassemble the solar battery module 30 and retrieve multiple solar battery cells 10 and other parts individually. Therefore, the recovery cost of the solar battery cells 10 is significantly lowered compared with the prior art solid connection by solder or conductive adhesive.

(2) The outer frame 16, multiple corrugated retention springs 13, and two casing plates 17 are mechanically assembled via the bolts 26 and nuts 26c. The solar battery module 30 can easily be assembled/disassembled, significantly reducing assemble/disassemble cost.

(3) Having the structure in which the solar battery cells 10 and corrugated retention springs 13 are clamped by two casing plates 17, the solar battery module 30 has an increased mechanical strength and applications as a window material.

(4) When the solar battery module 30 is used as a window material, a window excellent in appearance can be constituted depending on the design including the positioning pattern of solar battery cells 10 and the shape and size of corrugated retention springs 13, outer frame 16, and casing plates 17. A light-reflecting curtain can be provided inside the window to reflect light and illuminate the solar battery cells 10 on the back for increased electric power output.

(5) When the solar battery module 30 is used both as a wall or roof material and as a solar battery, the one of the two casing plates that is on the building side can be provided with a highly reflective coating on the inner surface or can be replaced with a highly reflective ceramic casing plate. The ceramic plate does not allow for natural lighting, but advantageously provides an increased mechanical strength and heat insulation.

(6) The silicone rubber thin films (the elastic films 23) effectively fill the gap between the casing plate 17 and outer frame 16 for airtightness. This is effective to prevent deterioration of the solar battery cells 10 due to the ambient air and increase heat insulation of the double glass when an inert gas is filled or under vacuum. The silicone rubber thin film can be replaced with another elastic transparent synthetic resin (such as EVA and PET) thin film.

Partly modified embodiments of the above described solar battery module 30 will be described hereafter.

[1] The outer frame 16 can be made of other materials such as a ceramic wiring substrate besides a glass-based epoxy resin wiring board given by way of example. Ceramic wiring substrates are expensive; however, they are heat resistant, fire resistant, excellent in mechanical strength, and stable in dimensions. The second outer frames 19 can also be made of a glass-based epoxy resin wiring board.

[2] The outer frame 16 can be provided with semiconductor elements other than the solar battery cells 10 or circuit components such as semiconductor chips, resistors, capacitors, and inductors to constitute a complex electronic functional module or apparatus containing the solar battery cells 10. For example, a circuit for converting direct current output of the solar battery module 30 to alternate current output and an output control circuit can be installed. Furthermore, LEDs and batteries can be installed besides the solar battery cells 10 to constitute an indicator in which the LEDs emit light using generated electric power. Alternatively, the solar battery module can be hybridized with other functional devices such as an LED light source for optical communication, or sensor elements and IC chips for transmitting information outside.

[3] In place of one or both of the two transparent glass casing plates 17, synthetic resin plates such as transparent acrylic resin, polycarbonate resin, silicone resin plates can be used. In such a case, the entire weight and cost of the solar battery module can be reduced.

[4] One of the transparent casing plates 17 or transparent synthetic resin plates can have a reflecting coating to reflect incident light and increase the electric power generation of the solar battery cells 10.

[5] The corrugated retention springs 13 can be constituted by a known spring material such as carbon steel, tungsten steel, nickel steel, nickel silver, and beryllium copper or by piano wires.

[6] The spherical solar battery cells 10 can be replaced with spherical light emitting diode cells to constitute a light emitting diode module used in displays or planar light emission illumination lamps.

[7] Solar battery cells or light emitting diode elements consisting of a spherical core having a thin semiconductor layer formed on the surface to create a pn-junction as described in the publication of WO99/10935 can be used in place of the above described spherical solar battery cells 10.

Embodiment 2

A solar battery module 40 (light receiving semiconductor module) of Embodiment 2 will be described hereafter with reference to FIGS. 12 to 17. The solar battery module 40 has a similar structure to the double glass structure in which the solar battery cells 10 are densely packed. The same solar battery cells 10 as described above are used and therefore the same reference numerals are used in the following description.

The solar battery module 40 comprises a holding mechanism 41 (holding means) holding multiple solar battery cells 10 in the manner that they are arranged two-dimensionally in a matrix of multiple columns and multiple rows with their conducting direction aligned in the column direction and multiple solar battery cells 10 are individually separable, a conductive connection mechanism 42 connecting in series the solar battery cells 10 in each column among multiple columns of solar battery cells 10 and connecting in parallel the solar battery cells in each row among multiple rows of solar battery cells 10, and conductive elastic members 43 applying a mechanical pressing force in the column direction to maintain the serial connection of multiple columns of solar battery cells 10 by the conductive connection mechanism 12.

The holding mechanism 41 comprises a tabular storage casing 45 forming a flat rectangular storage zone 44 to store multiple columns and multiple rows of solar battery cells 10 (a set of solar battery cells), multiple conductive wires 42a, and multiple rubber balls 56. The storage casing 45 has an outer frame 46 and two transparent polycarbonate resin casing plates 47 having a thickness of 3 mm and closing the top and bottom sides of the storage zone 44. The outer frame 46 has a pair of first outer frames 48 parallel to the column direction on either side of the storage zone 44 and a pair of second outer frames 49 on either end of the storage zone 44 between the ends of the pair of first outer frames 48. The casing plates 47 can be transparent glass plates.

The first outer frames 48 each consist of a white polycarbonate resin plate having a thickness equal to or slightly larger than the diameter of the solar battery cells 10. The first outer frames 48 have multiple bolt holes 50. The second outer frames 49 each consist of a white polycarbonate resin plate having the same thickness as the first outer frames 48. The second outer frames 49 each have a terminal plate 51 (external terminal) provided integrally in the middle of the thickness and protruding outward in the column direction. They also have bolt holes 52 formed near either end and elongated in the column direction. The upper and lower casing plates 47 have multiple bolt holes 53 and 54 corresponding to the bolt holes 50 and 52 of the first and second outer frames 48 and 49, respectively.

With the pair of first outer frames 48 being placed in parallel with a space for the storage zone 44 in between, multiple conductive copper wires 42a are placed in the row direction across the pair of first outer frames 48 at intervals equal to the distance between the positive and negative electrodes 5 and 6 of the solar battery cells 10. The ends of the multiple conductive wires 42a are fixed to the pair of first outer frames 48 by integral molding. The conductive wires 42a are silver-plated wires having a diameter of 0.5 mm and elastically deformable under elastic force of corrugated springs 43. The upper and lower casing plates 47 have on the entire inner surface a transparent silicone rubber coating 47a (for example having a thickness of 0.05 mm) as an elastic film.

For assembling the solar battery module 40, the pair of first outer frames 48 and multiple conductive wires 42a are placed on the top surface of the lower casing plate 47. Multiple solar battery cells 10 are fitted in between a pair of conductive wires 42a in each row with their conducting direction aligned in the column direction and with mutual contact, whereby the solar battery cells 10 in each row are connected in parallel with their positive and negative electrodes 5 and 6 in contact with the pair of conductive wires 42a. Spherical silicone rubbers 56 having the same diameter as the solar battery cells 10 are fitted in between the ends of multiple solar battery cells 10 and the first outer frames 48 in each row. In each row, a pair of spherical rubbers 56 biases the multiple solar battery cells 10 so that they abut against each other. Therefore, the solar battery cells 10 and conductive wires 42a equally make contact with each other. The solar battery cells 10 are not dislocated and are stably held.

Relay conductors 55, corrugated springs 43, and second outer frames 49 are fitted in between the pair of first outer frames 48 at the ends in the column direction and temporality held with the relay conductors 55 abutting against the conductive wires 42a and the terminal plates 51 of the second outer frames 49 abutting against the corrugated springs 43. Then, the upper casing plate 47 is placed on the outer frame 46. Bolts 57 provided with for example fluororesin washers 57a and steel disc springs 57b are inserted in the bolt holes 50, 52, 53, and 54 of the upper casing plate 47, first and second outer frames 48 and 49, and lower casing plate 47 and fastened to nuts 57c with for example fluororesin washers 57a in between.

Here, the second outer frames 49 are properly positioned using the positioning bolt holes 52 of the second outer frames 49 so that the pressing force of the corrugated springs 43 ensures the mechanical contact and, consequently, electric contact between the positive and negative electrodes 5 and 6 of the solar battery cells 10 and the facing conductive wires 42a. The relay conductors 55 are silver-plated copper square bars. The corrugated springs 43 are formed by corrugating an elastic strip of phosphor bronze having a thickness of 0.4 mm and a width of 1.9 mm and silver-plating its surface.

As the bolts 57 are fastened, the elasticity of the silicone rubber coatings 47a serves to fill the gaps between the casing plates 47 and outer frame 46 to some extent. If there is still any gap between them, a liquid silicon rubber or butyl rubber filler or packing can be used to seal them, thereby sealing the storage zone 44.

Figure 17:
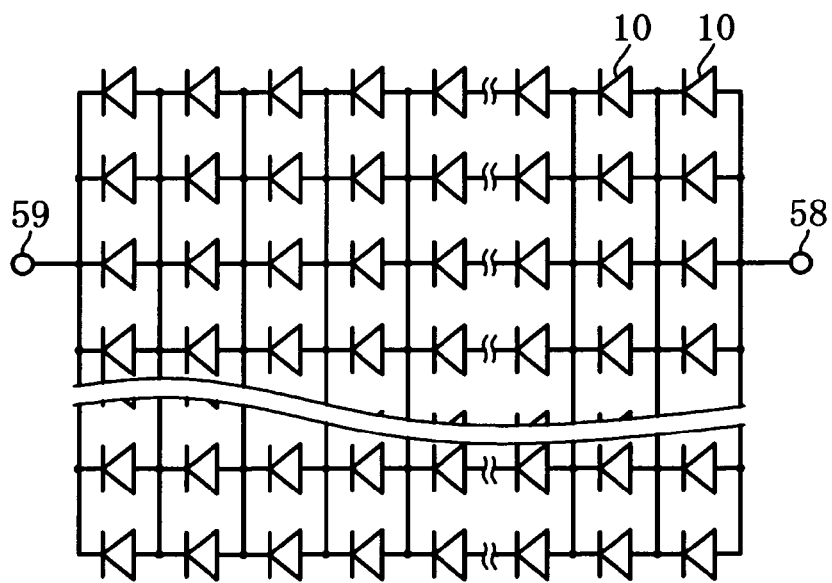
FIG. 17 is an equivalent circuit to the solar battery module.
Figure 18:
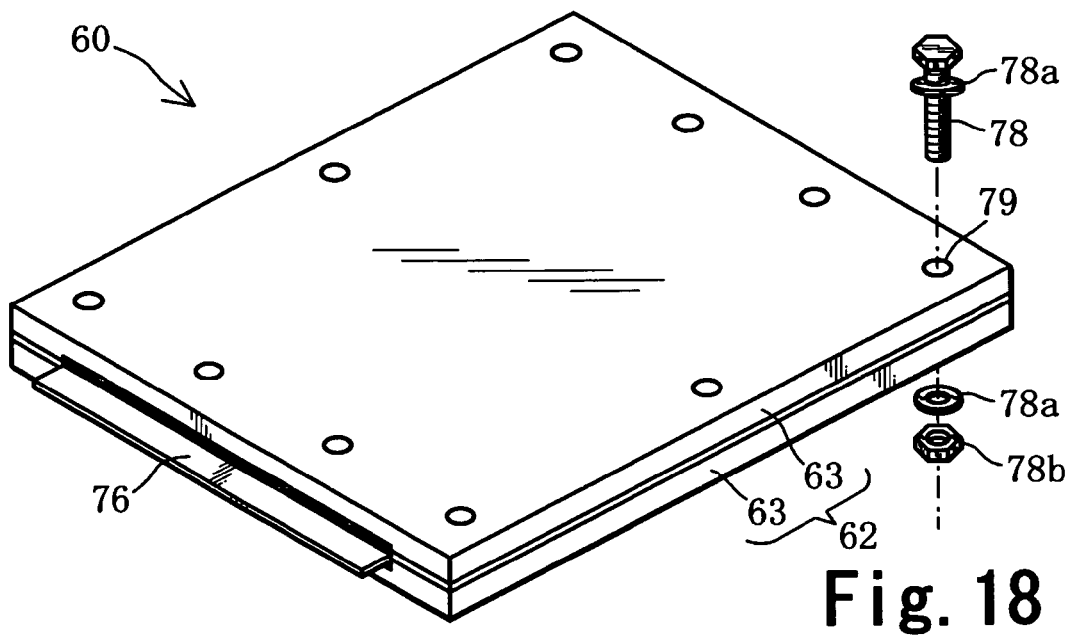
FIG. 18 is an exploded perspective view of the solar battery module of Embodiment 3.
Figure 19:
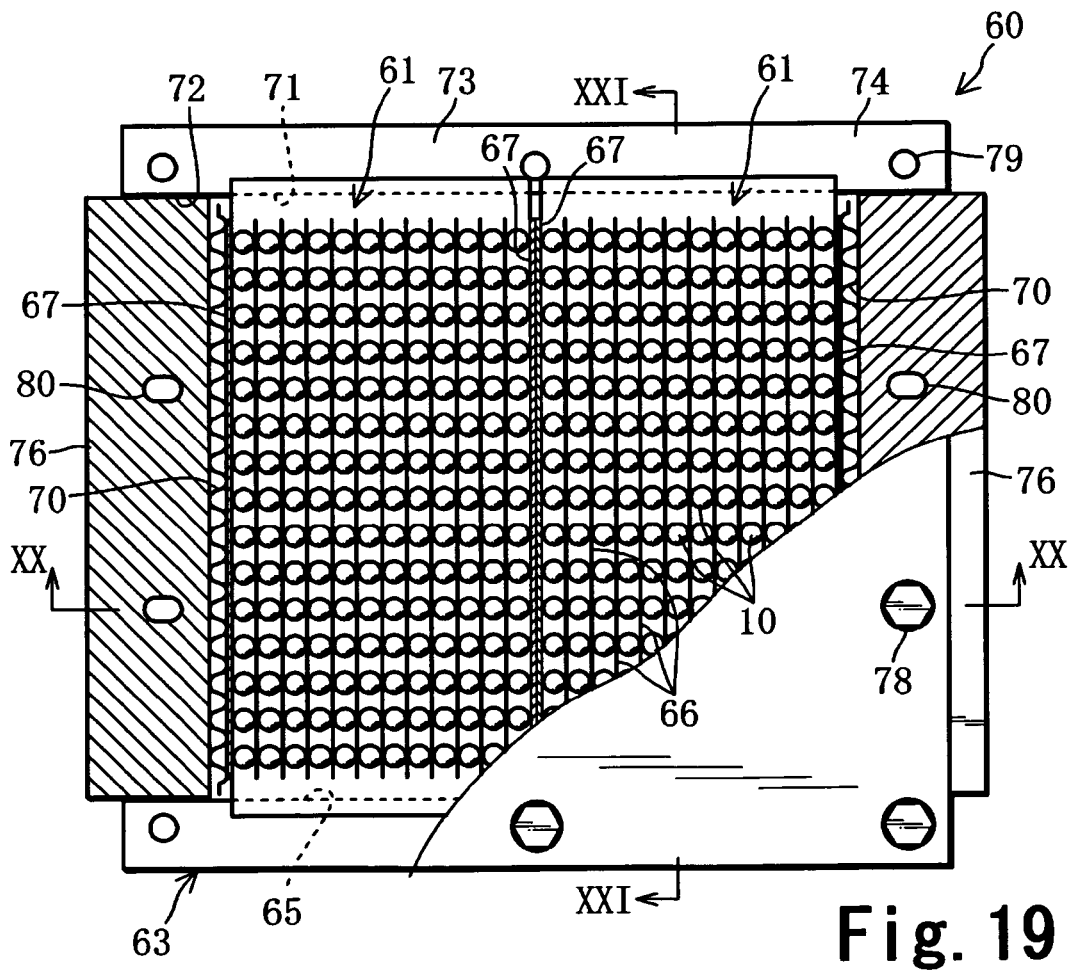
FIG. 19 is a cross-sectional view of the solar battery module of FIG. 18.
Figure 20:
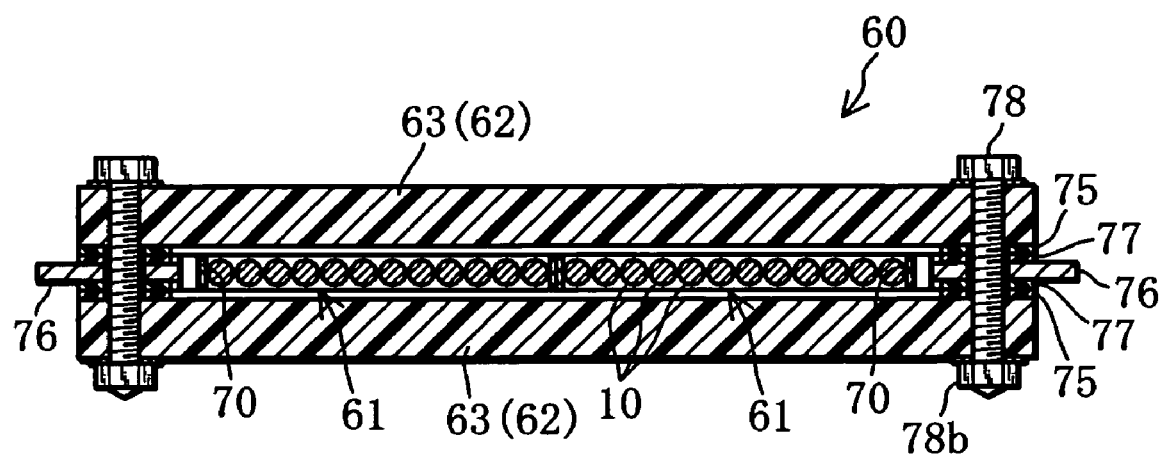
FIG. 20 is a cross-sectional view at the line XX-XX in FIG. 19.
Figure 21:
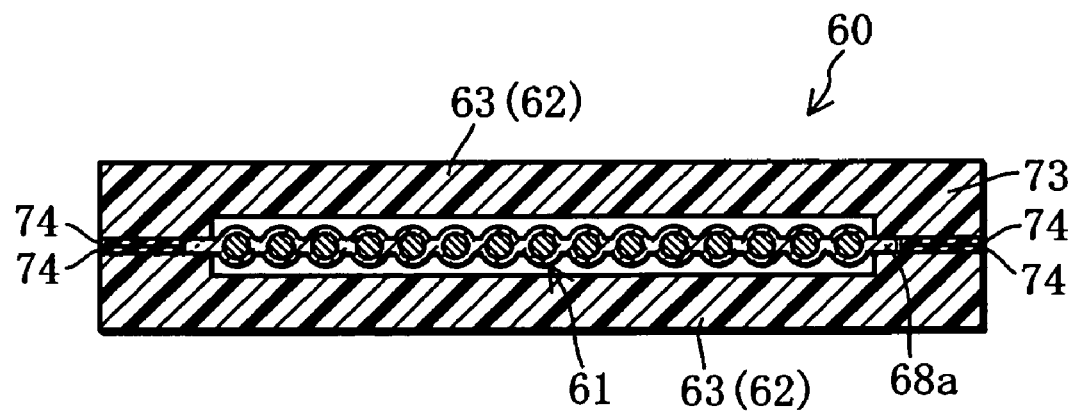
FIG. 21 is a cross-sectional view at the line XXI-XXI in FIG. 19.

In the above solar battery module 40, multiple solar battery cells 10 are arranged in a matrix of multiple columns and multiple rows. In this set of solar battery cells 10, multiple solar battery cells 10 in each row are connected in parallel by a pair of conductive wires 42a on either side of the row and multiple solar battery cells 10 in each column are connected in series via multiple conductive wires 42a (conductive elastic members). Particularly, a pair of corrugated springs 43 at the ends in the column direction presses the relay conductors 55 toward the storage zone 44, maintaining the serial connection of multiple columns of solar battery cells 10. FIG. 17 shows an equivalent circuit to the solar battery nodule 40. One terminal plate 51 is a positive terminal 58 protruding outside and the other terminal plate 51 is a negative terminal 59 protruding outside. Electric power generated in the solar battery module 40 can be retrieved through the positive and negative terminals 58 and 59.

The solar battery module 40 has an increased output per unit area of the solar battery module; however, it has reduced natural lighting and see-through properties. The solar battery module 40 is suitable for arranging the solar battery cells 10 at a relatively high density for higher output in a limited area. The output current is increased as the number of solar battery cells connected in parallel is increased. The output voltage is raised as the number of solar battery cells connected in series is increased. A single solar battery cell 10 produces an output voltage of approximately 0.6 volt.

The conductive connection mechanism 42 of the solar battery module 40 constitutes a mesh-structure circuit as shown in FIG. 17. Then, if some solar battery cells 10 fail and are open or if some solar battery cells 10 are electrically disconnected or if some solar battery cells 10 are disabled because they are in shade, the current flows through an alternative path bypassing the disabled solar battery cells 10 and the other normal solar battery cells 10 do not entirely or partly fail to generate electric power. Their influence on reduction in output of the entire solar battery module 40 can be minimized.

For repair or disposal of the solar battery module 40, multiple bolts 57 and nuts 57c are simply removed to disassemble the solar battery module 40 and retrieve multiple solar battery cells 10 individually. Then, some failed solar battery cells 10 can be replaced with new solar battery cells 10 or all solar battery cells 10 can be recovered for reuse. Not only the solar battery cells 10 but also other components can be removed and most of them can be reused. Therefore, the recovery cost of solar battery cells 10 is significantly reduced compared with the prior art solid connection using solder or conductive adhesive.

In the solar battery module 40, the solar battery cells 10 and conductive wires 42a are electrically connected by means of a mechanical pressing force without solder or conductive adhesive, significantly reducing production cost. The solar battery module 40 has the terminal plates 50 protruding at the ends. Multiple solar battery modules 40 can easily be connected in series simply by contacting their terminal plates 51 with each other.

Only one (for example the positive electrode) terminal plate can protrude outside and the other (for example the negative electrode) terminal plate 51 can be exposed in the bottom of a recess. In such a case, multiple solar battery modules 40 can be connected in series with almost no space in between.

The conductive connection mechanism 42 of the solar battery module 40 effectively uses the conductive wires 42a for serial and parallel connections. The conductive connection mechanism 42 has a simple structure, which is advantageous in cost. There is no need of any transparent synthetic resin filler for covering around multiple battery cells 10, saving filler cost and filling facility and cost. It is also advantageous in terms of disposal. The solar battery module 40 has an inner space that provides heat and sound insulation, serving both as a window material and as a light power generator.

The numbers of rows and columns of the matrix of multiple solar battery cells in the solar battery module 40 of the above embodiment are given by way of example. In practice, the module has larger numbers of rows and columns. In the above embodiment, the solar battery module 40 having the solar battery cells 10 is described. The present invention is similarly applicable to a light emitting diode module (light emitting diode display or light emitting diode illumination lamp) in which spherical light emitting diode elements converting electric energy to light energy are installed in place of the solar battery cells 10.

Among the modifications [1] to [7] given at the end of Embodiment 1, modifications applicable to the solar battery module 40 of this embodiment will be acceptable as in Embodiment 1.

Embodiment 3

A solar battery module 60 of Embodiment 3 will be described with reference to FIGS. 18 to 27.

In the solar battery module 60, multiple solar battery cells 10 are divided into, for example, two groups to constitute two small tabular segment modules 61 and the two segment modules 61 are installed and connected in series in a storage casing 62 so that multiple solar battery cells 10 are assembled or separated in multiple groups. The solar battery cells 10 themselves are the same as the solar battery cells in Embodiments 1 and 2 and the same reference numbers are used in the following explanation.

As shown in FIGS. 18 to 21, the solar battery module 60 comprises two segment modules 61 and a storage casing 62 forming a flat storage zone 65 for storing the two segment modules 61. The segment modules 61 are formed by arranging multiple solar battery cells 10 in a matrix of multiple rows and multiple columns, bonding them to multiple conductive wires 66 using lead-free conductive adhesive to connect them in series and in parallel, and molding the entire structure in a transparent synthetic resin to a tabular form.

The segment modules 61 are serially arranged in the storage zone 65 within the storage casing 62 and electrically connected by means of mechanical pressure from corrugated springs 70 (conductive connection members). In this embodiment, the solar battery module 60 having two segment modules 61 is described. However, the number of segment modules 61 installed in the storage casing 62 is not restricted to two. As the number of segment modules 61 is increased, the solar battery module 60 can have a larger output.

The segment module 61 will be described hereafter with reference to FIGS. 22 to 26.

Figure 22:
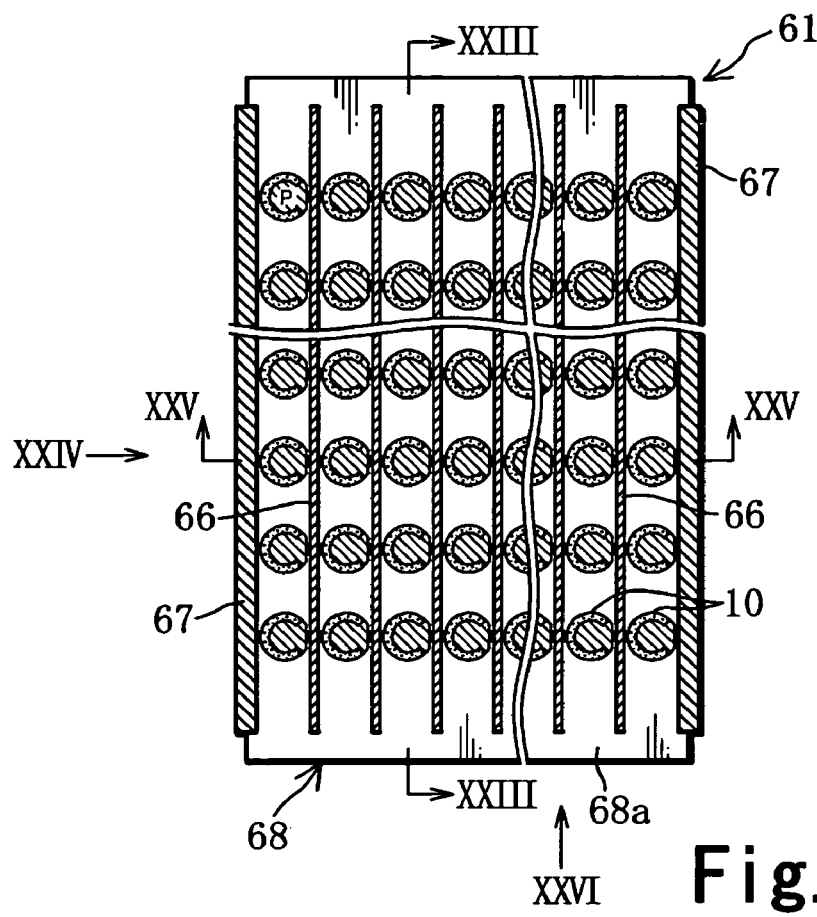
FIG. 22 is a plane view of a segment module of the solar battery module of FIG. 18.
Figure 23:
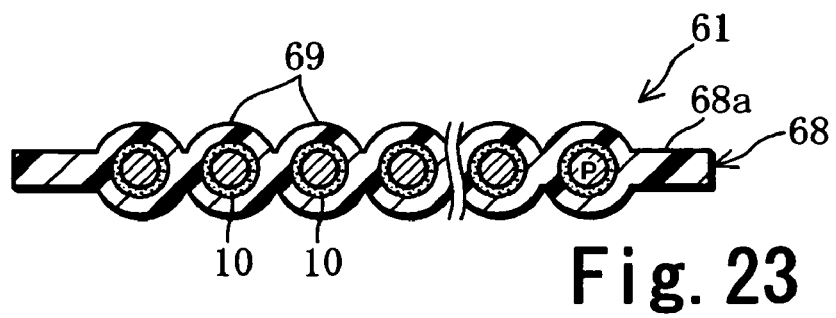
FIG. 23 is a cross-sectional view at the line in FIG. 22.
Figure 24:
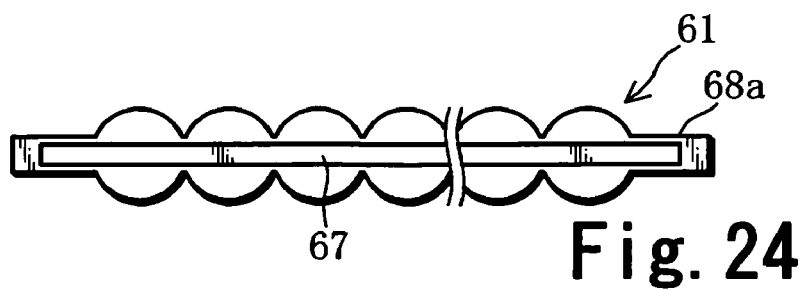
FIG. 24 is a side view of the segment module seen in the arrowed direction XXIV in FIG. 22.
Figure 25:
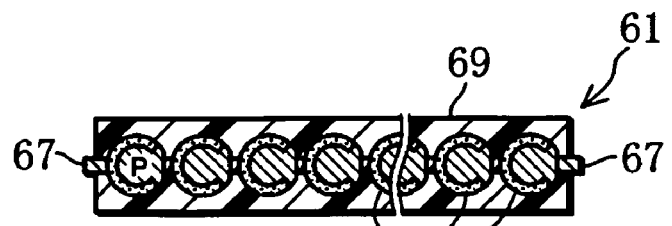
FIG. 25 is a cross-sectional view at the line XXV-XXV in FIG. 22.
Figure 26:
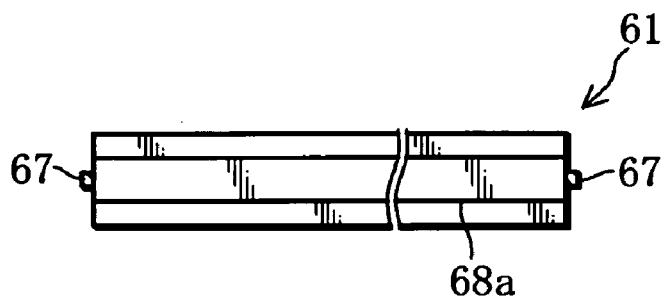
FIG. 26 is a side view of the segment module seen in the arrowed direction XXVI in FIG. 22.

As shown in FIG. 22, multiple solar battery cells 10 are arranged in a matrix of multiple rows and multiple columns with their conducting direction aligned in the column direction. Adjacent columns of solar battery cells 10 are spaced by a distance approximately half of the diameter of the solar battery cells 10. The distance can be larger or smaller, being determined on an arbitrary basis. For example, columns are not spaced and the solar battery cells 10 in each row abut against each other.

Thin conductive wires 66 having a rectangular cross-section are provided between multiple solar battery cells 10 in a row and multiple solar battery cells 10 in the adjacent rows, abutting against their positive and negative electrodes 5 and 6. Connection conductors 67 having a larger rectangular cross-section than the conductive wires 66 abut against the positive or negative electrode 5 or 6 of multiple solar battery cells 10 in the rows at the ends in the column direction. The positive and negative electrodes 5 and 6 of solar battery cells 10 are bonded to the conductive wires 66 or connection conductors 67 by a known conductive adhesive (such as silver-epoxy resin) and heat-cured for fixing.

In this way, multiple solar battery cells 10 in each row are connected in parallel by a pair of conductive wires 66 or by a conductive wire 66 and a connection conductor 67. Multiple solar battery cells 10 in each column are connected in series by multiple conductive wires 66. Multiple solar battery cells 10 of the segment module 61 are connected in series and in parallel by multiple conductive wires 66 and two connection conductors 67. Then, a conductive connection mechanism connecting in series the solar battery cells in each column and connecting in parallel the solar battery cells in each row is provided.

The above multiple serially and parallel connected solar battery cells 10, conductive wires 66, and connection conductors 67 are entirely molded in a transparent synthetic resin (such as silicone resin) to a tabular form. The connection conductors 67 at the ends are exposed from the edges of a synthetic resin plate 68. The synthetic resin plate 68 has cylindrical lens parts 69 covering the rows of solar battery cells 10 and flat holding parts 68a at the ends. The cylindrical lens parts 69 collect incident light to improve the output of the solar battery cells 10.

The solar battery module 60 having two segment modules 61 as described above will be described hereafter with reference to FIGS. 18 to 21.

The storage casing 62 is made of a transparent synthetic resin such as polycarbonate resin, acrylic resin, and silicon resin. The storage casing 62 is formed by superimposing a pair of upper and lower casing members 63, 63 having the same structure and fastening them with bolts. The casing members 63 each have a recess 71 forming a half of the storage zone 65 and terminal mounting grooves 72 continued from either end of the recess 71.

The casing member 63 has a pair of lands 73 (sidewalls) outside the recess 71, where for example a silicone rubber elastic coating 74 (for example a thickness of approximately 0.1 mm) covers approximately outer two thirds of the surface. The terminal mounting grooves 72 also have the same rubber coating 75 on the inner surface. The solar battery module 60 is assembled by housing two segment modules 61 in the recess 71 of the lower casing member 63, placing the upper casing member 63, and clamping the holding parts 68a of the segment modules 61 at the ends in the row direction by the upper and lower lands 73.

Then, corrugated springs 70 and external terminals 76 are inserted in the flat terminal mounting openings consisting of the upper and lower terminal mounting grooves 72 at the ends in the column direction. Rubber packings 77 are interposed between the external terminal 76 and storage casing 62. Then, the upper and lower casing members 63 and the upper and lower casing member 63 and external terminals 76 are fastened together by bolts. Here, bolts 78 are inserted in bolt holes 79 and 80 together with for example fluororesin washers 78a and fastened to nuts 78b together with underneath fluororesin washers 78a.

The bolt holes 80 of the external terminals 76 are elongated in the column direction. The fastening position of the external terminals 76 can be adjusted using the bolt holes 80 so that the corrugated springs 70 provide a proper pressing force. In this way, with the connection conductors 67 making mechanical contact with each other in the center of the solar battery module 60, the two segment modules 61 are electrically connected in series. The two segment modules 61 make mechanical contact with and therefore electric connection to the external terminals 76 via the corrugated springs 70 at the ends. The external terminals 76 protrude from the storage casing 62 at the ends and serve as the positive and negative electrodes of the solar battery module 60 for external retrieval of output.

Figure 27:
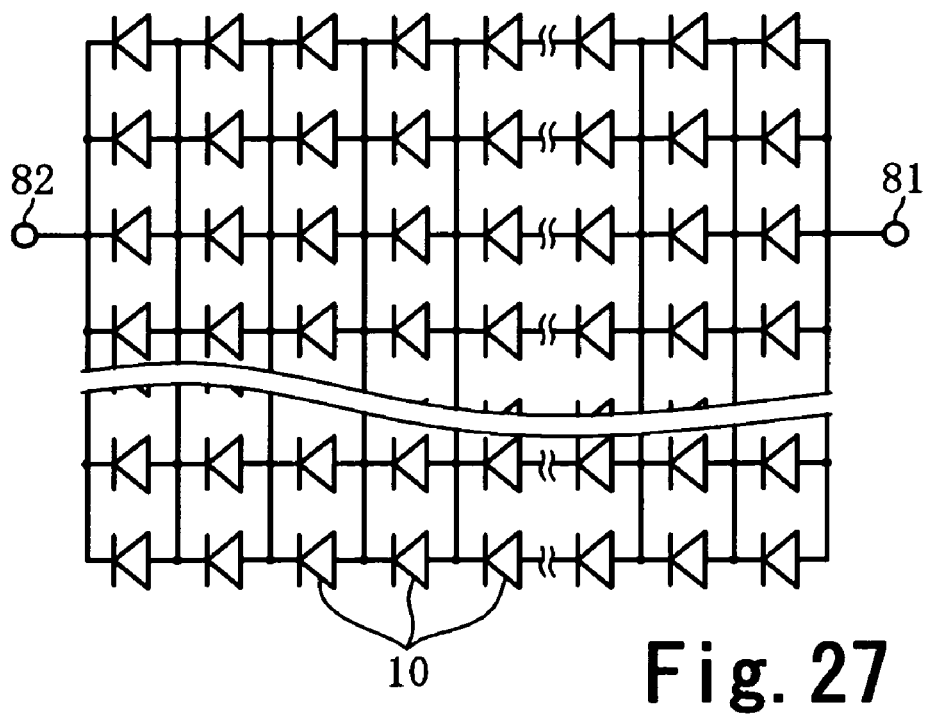
FIG. 27 is an equivalent circuit to the solar battery module.

FIG. 27 shows an equivalent circuit to the mesh structure of the solar battery module 60. This equivalent circuit has the same efficacy as the equivalent circuit of Embodiment 2. Here, the positive terminal 81 and negative terminal 82 allows for external retrieval of electric power.

Gaps can be filled with a sealing material such as resins and rubbers where necessary to seal the space in which the segment modules 61 are housed and prevent inflow of the ambient atmosphere.

In the solar battery module 60, two segment modules 61 are mechanically connected in series by the corrugated springs 70 in the shared storage casing 62, fastened and secured in position by the bolts 78 and nuts 78b, and sealed from the ambient air by the rubber coatings 74 and 75 and packings 77. The whole storage casing 62 can be disassembled to replace or retrieve the segment modules 61 for reuse. When the module 60 is used as a window glass, the solar battery cells 10 spaced from each other provide excellent natural lighting and the space within the storage casing 62 provides heat insulation. When synthetic resin casing members 63 are used, they will be lighter and not easily broken compared with glass.

The above described solar battery module has the following functions and advantages.

(1) The connections between the segment modules 61 and between the segment module 61 and external terminal 76 are achieved by means of a mechanical pressing force from the corrugate springs 70; therefore, there is no need of bonding by solder or a jointing material. Then, there is no need of heating process for electrical connection. The segment modules 61, external terminals 76, or corrugated springs 70 can be retrieved from the solar battery module 60 to use them in other solar battery modules. Multiple solar battery modules 60 can easily be connected in series simply by contacting their external terminals 76 with each other.

(2) The elastic conductive corrugated springs 70 are used to ensure electrical connection. They absorb dimensional changes (expansion or contraction) in association with temperature changes and mechanical shocks, preventing excessive stress on the solar battery cells 10.

(3) The distance between the columns in the segment module 61 can properly be changed and the thickness of the conductive wires 66 can be determined on an arbitrary basis. A solar battery module 60 or light emitting diode module or a panel consisting of two or more of them serving as a beautifully designed building material can be produced by properly selecting the proportion between natural lighting (see-through) property and electric power generation.

(4) The spherical solar battery cells 10 can use incident light in various directions for electric power generation. When one or multiple solar battery modules 60 are used as a window glass, the room light also can be used for electric power generation.

Partly modified embodiments of Embodiment 3 will be described hereafter.

[1] The numbers of rows and columns of the matrix of multiple solar battery cells 10 in the segment module 61 are given by way of example. The segment module can have larger numbers of rows and multiple columns. The number of segment modules 61 installed in the solar battery module 60 is not restricted to two and can be determined on an arbitrary basis. Multiple segment modules 61 are arranged in multiple columns, not in one column, in the solar battery module 60. In other words, multiple segment modules 61 are arranged in a matrix of multiple rows and multiple columns in a single solar battery module 60. In such a case, the holding parts 68a of the segment module 61 can be eliminated so that the segment module 61 abuts against the inner surface of the storage zone 65.

[2] With regard to the external terminals 76 of the solar battery module 60, it is advantageous for serially connecting multiple solar battery modules 60 that one (for example the positive electrode end) external terminal 76 protrudes outside as shown in the figure and the other (for example the negative electrode end) external terminal 76 is withdrawn in the terminal mounting opening and connectable to one (for example at the positive electrode end) of the external terminals 76 of an adjacent solar battery module 60.

[3] When the solar battery module 60 is used as a wall material that does not require natural lighting or see-through property, a light reflecting or scattering plate or sheet can be placed behind the solar battery cells 10. Light passing between the solar battery cells 10 is reflected behind the solar battery cells 10 and increase the output of the solar battery cells 10 in the solar battery module 60. Alternatively, light reflected forward increases brightness in a light emitting diode module.

[4] Applications include solar battery modules integrated with a building material such as a roof, skylight, window, curtain wall, facade, eave, and looper, outdoor light emitting diode displays, and functional units on advertising pillars, automobiles, aircraft, and boats for solar electric power generation or display or for both.

[5] Various sensors, signal receiver, signal transmitter, ac/dc converter, frequency converter, logic circuits, and CPU and peripheral circuitry can be installed on the lands 73 of the casing members 63 to control the input/output of the solar battery module or light emitting diode module.

INDUSTRIAL APPLICABILITY

The light receiving or light emitting semiconductor module of the present invention is effectively used in solar battery panels or light emitting diode displays and illumination apparatuses.

What is claimed is:

1. A light receiving or light emitting semiconductor module comprising multiple spherical semiconductor elements having light receiving or light emitting function comprising:
    positive and negative electrodes provided to each of said multiple semiconductor elements at opposite positions about the center thereof;
    a holding means for holding said multiple semiconductor elements in a manner that they are arranged in multiple columns and multiple rows with their conducting direction aligned in a column direction and multiple semiconductor elements are separable individually or in multiple groups;
    a conductive connection mechanism connecting in series the semiconductor elements in each column or in two adjacent columns among multiple columns of semiconductor elements and connecting in parallel the semiconductor elements in each row among multiple rows of semiconductor elements;
    conductive elastic members applying a mechanical pressing force in a column direction to maintain the serial connection of multiple columns of semiconductor elements by said conductive connection mechanism;
    said holding means has a tabular storage casing forming a fiat storage zone for storing multiple semiconductor elements and comprising multiple separable members, the storage casing has a pair of casing plates parting either side of said storage zone from the outside, and at least one of the casing plates is made of light transmissible glass or synthetic resin; and
    said holding means has multiple corrugated retention springs arranged nearly in parallel in said storage casing and comprising conductive band plates, multiple semiconductors in each row are held with their positive and negative electrodes clamped by a pair of corrugated retention springs, and said conductive connection mechanism comprises said multiple corrugated retention springs.

2. A light receiving or light emitting semiconductor module comprising multiple spherical semiconductor elements having light receiving or light emitting function comprising:
    positive and negative electrodes provided to each of said multiple semiconductor elements at opposite positions about the center thereof;
    a holding means for holding said multiple semiconductor elements in a manner that they are arranged in multiple columns and multiple rows with their conducting direction aligned in a column direction and multiple semiconductor elements are separable individually or in multiple groups;
    a conductive connection mechanism connecting in series the semiconductor elements in each column or in two adjacent columns among multiple columns of semiconductor elements and connecting in parallel the semiconductor elements in each row among multiple rows of semiconductor elements;
    conductive elastic members applying a mechanical pressing force in a column direction to maintain the serial connection of multiple columns of semiconductor elements by said conductive connection mechanism;
    said holding means has a tabular storage casing forming a fiat storage zone for storing multiple semiconductor elements and comprising multiple separable members, the storage casing has a pair of casing plates parting either side of said storage zone from the outside, and at least one of the casing plates is made of light transmissible glass or synthetic resin;

said holding means has multiple conductive wires arranged in parallel in said storage casing, multiple semiconductor elements in each row are held with their positive and negative electrodes clamped by a pair of conductive wires;

said multiple semiconductor elements are arranged in a matrix of multiples rows and multiple columns, multiple semiconductor elements in each row abut against each other and multiple semiconductor elements in each column abut against each other with a conductive wire in between, and said conductive connection mechanism comprises multiple conductive wires;

said storage casing has a pair of first outer frames and a pair of second outer frames provided around a periphery of said storage zone in a rectangular form between said pair of casing plates, said pair of first outer frames is provided on either side of said storage zone in parallel to a column direction, and a pair of ends of each of said multiple conductive wires are fixed to the pair of first outer frames; and the pair of second outer frames is provided between a pair of ends of the pair of first outer frames in parallel to a row direction, and relay conductors abutting against the conductive wires facing the second outer frames and corrugated springs abutting against the relay conductors and comprising conductive band plates are provided between the second outer frames and the conductive wires facing them.

3. The light receiving or light emitting semiconductor module according to claim 2, wherein the second outer frames are provided with terminal plates abutting against said corrugated springs and protruding from said storage casing.

4. The light receiving or light emitting semiconductor module according to any of claims 3 or 2, wherein said pairs of first and second outer frames and pair of casing plates are detachably coupled by multiple bolts and nuts.

5. The light receiving or light emitting semiconductor module according to any of claim 3 or 2, wherein said pairs of casing plates has light transmissible elastic films on their inner surfaces.

6. A light receiving or light emitting semiconductor module comprising multiple spherical semiconductor elements having light receiving or light emitting function, characterized by comprising:

positive and negative electrodes provided to each of said multiple semiconductor elements at opposite positions about the center thereof;

a holding means for holding said multiple semiconductor elements in a manner that they are arranged in multiple columns and multiple rows with their conducting direction aligned in a column direction and multiple semiconductor elements are separable individually or in multiple groups;

a conductive connection mechanism connecting in series the semiconductor elements in each column or in two adjacent columns among multiple columns of semiconductor elements and connecting in parallel the semiconductor elements in each row among multiple rows of semiconductor elements;

conductive elastic members applying a mechanical pressing force in a column direction to maintain the serial connection of multiple columns of semiconductor elements by said conductive connection mechanism;

said holding means has a tabular storage casing forming a flat storage zone for storing multiple semiconductor elements and comprising multiple separable members, the storage casing has a pair of casing plates parting either side of said storage zone from the outside, and at least one of the casing plates is made of light transmissible glass or synthetic resin;

multiple semiconductor elements divided into multiple groups;

multiple semiconductor elements in each group are arranged in a matrix of multiple rows and multiple columns and adjacent semiconductor elements among multiple semiconductor elements in each row abut against each other or are slightly spaced from each other;

said conductive connection mechanism has multiple conductive wires provided between rows of multiple rows of semiconductor elements and a pair of connection conductors provided outside a pair of end rows in a column direction in parallel to a row direction;

multiple semiconductor elements, multiple conductive wires, a pair of connection conductors in each group are partly embedded in a light transmissible synthetic resin to constitute a tabular segment module;

said multiple segment modules are serially arranged in the storage zone of said storage casing and connection conductors of adjacent segment modules are electrically connected;

said storage casing comprises a pair of casing plates superimposed face-to-face, said casing plates each have sidewalls closing the storage zone at a pair of ends in the row direction and terminal mounting grooves extending from the storage zone to either end of the casing plate in the column direction, and terminal plate protruding outside are mounted in a pair of facing terminal mounting grooves of the storage casing, respectively, and fixed to the storage casing; and corrugated springs as said conductive elastic members are mounted between said terminal plates and the connection conductors of the segment modules that face the terminal plates, the elastic biasing force of the pair of corrugated springs maintains the serial electrical connection of multiple segment modules.

7. The light receiving or light emitting semiconductor module according to claim 6, wherein said terminal plates are fixed in the manner that their positions are adjustable in relation to said storage casing.

8. A light receiving or light emitting semiconductor module comprising multiple spherical semiconductor elements having light receiving or light emitting function comprising:

positive and negative electrodes provided to each of said multiple semiconductor elements at opposite positions about the center thereof;

a holding means for holding said multiple semiconductor elements in a manner that they are arranged in multiple columns and multiple rows with their conducting direction aligned in a column direction and multiple semiconductor elements are separable individually or in multiple groups;

a conductive connection mechanism connecting in series the semiconductor elements in each column or in two adjacent columns among multiple columns of semiconductor elements and connecting in parallel the semiconductor elements in each row among multiple rows of semiconductor elements;

conductive elastic members applying a mechanical pressing force in a column direction to maintain the serial connection of multiple columns of semiconductor elements by said conductive connection mechanism;

said holding means has a tabular storage casing forming a flat storage zone for storing multiple semiconductor elements and comprising multiple separable members, the storage casing has a pair of casing plates parting either side of said storage zone from the outside, and at least one of the casing plates is made of light transmissible glass or synthetic resin;

multiple semiconductor elements divided into multiple groups;

multiple semiconductor elements in each group are arranged in a matrix of multiple rows and multiple columns and adjacent semiconductor elements among multiple semiconductor elements in each row abut against each other or are slightly spaced from each other;

said conductive connection mechanism has multiple conductive wires provided between rows of multiple rows of semiconductor elements and a pair of connection conductors provided outside a pair of end rows in a column direction in parallel to a row direction;

multiple semiconductor elements, multiple conductive wires, a pair of connection conductors in each group are partly embedded in a light transmissible synthetic resin to constitute a tabular segment module;

said multiple segment modules are serially arranged in the storage zone of said storage casing and connection conductors of adjacent segment modules are electrically connected;

said storage casing comprises a pair of casing plates superimposed face-to-face, said casing plates each have sidewalls closing the storage zone at a pair of ends in the row direction and terminal mounting grooves extending from the storage zone to either end of the casing plate in the column direction, and terminal plate protruding outside are mounted in a pair of facing terminal mounting grooves of the storage casing, respectively, and fixed to the storage casing; and said terminal plates are fixed in the manner that their positions are adjustable in relation to said storage casing.

* * * * *